(12) United States Patent
Okuni et al.

(10) Patent No.: US 12,040,790 B2
(45) Date of Patent: Jul. 16, 2024

(54) ELECTRONIC APPARATUS, SWITCHING SYSTEM, AND CONTROL METHOD

(71) Applicants: KABUSHIKI KAISHA TOSHIBA, Tokyo (JP); TOSHIBA ENERGY SYSTEMS & SOLUTIONS CORPORATION, Kawasaki (JP)

(72) Inventors: Hidenori Okuni, Yokohama Kanagawa (JP); Takafumi Sakamoto, Machida Tokyo (JP); Masaki Nishikawa, Yokohama Kanagawa (JP); Koji Akita, Yokohama Kanagawa (JP)

(73) Assignees: KABUSHIKI KAISHA TOSHIBA, Tokyo (JP); TOSHIBA ENERGY SYSTEMS & SOLUTIONS CORPORATION, Tokyo (JP)

( * ) Notice: Subject to any disclaimer, the term of this patent is extended or adjusted under 35 U.S.C. 154(b) by 0 days.

(21) Appl. No.: 18/181,587

(22) Filed: Mar. 10, 2023

(65) Prior Publication Data

US 2024/0072797 A1 Feb. 29, 2024

(30) Foreign Application Priority Data

Aug. 31, 2022 (JP) .................. 2022-138786

(51) Int. Cl.
| | |
|---|---|
| *H02M 1/44* | (2007.01) |
| *G01R 29/26* | (2006.01) |
| *H02M 7/42* | (2006.01) |
| *H03K 17/94* | (2006.01) |

(52) U.S. Cl.
CPC ............ *H03K 17/94* (2013.01); *G01R 29/26* (2013.01); *H02M 7/42* (2013.01)

(58) Field of Classification Search
CPC ..................................................... H03K 17/94
See application file for complete search history.

(56) References Cited

U.S. PATENT DOCUMENTS

| | | |
|---|---|---|
| 2007/0290894 A1 | 12/2007 | Ng et al. |
| 2009/0195071 A1 | 8/2009 | Furuse et al. |
| 2010/0007221 A1 | 1/2010 | Ye et al. |
| 2013/0194015 A1 | 8/2013 | Ranstad et al. |
| 2013/0314059 A1 | 11/2013 | Telefus |
| 2016/0077142 A1 | 3/2016 | Kanayama et al. |

(Continued)

FOREIGN PATENT DOCUMENTS

| | | |
|---|---|---|
| JP | 2009189143 A | 8/2009 |
| JP | 5047829 B2 | 7/2012 |

(Continued)

OTHER PUBLICATIONS

"Power Electronics", Osaka Prefecture University Technical Junior College, Electronic Information Course. Accessed at http://www2-kawakami.ct.osakafu-u.ac.jp/lecture/power_electronics/.

(Continued)

*Primary Examiner* — Jared Fureman
*Assistant Examiner* — Esayas G Yeshaw
(74) *Attorney, Agent, or Firm* — Holtz, Holtz & Volek PC

(57) ABSTRACT

An electronic apparatus includes a noise measurement circuitry that measures electromagnetic noise in a surrounding environment, and a controller that controls timing of turning on or off a switching circuit based on the electromagnetic noise measured by the noise measurement circuitry.

14 Claims, 10 Drawing Sheets

(56) References Cited

U.S. PATENT DOCUMENTS

| | | |
|---|---|---|
| 2018/0309360 A1 | 10/2018 | Nam et al. |
| 2021/0194408 A1* | 6/2021 | Demsa ................. F03D 7/0264 |
| 2022/0069616 A1* | 3/2022 | Nakamori ................ H02J 3/46 |
| 2023/0027702 A1* | 1/2023 | Henspeter ............ G11C 29/028 |
| 2023/0344336 A1* | 10/2023 | Jeong ..................... H02S 40/32 |

FOREIGN PATENT DOCUMENTS

| | | |
|---|---|---|
| JP | 2016063581 A | 4/2016 |
| JP | 2021101591 A | 7/2021 |
| JP | 2021145447 A | 9/2021 |
| JP | 2022037310 A | 3/2022 |
| KR | 20200068433 A | 6/2020 |

OTHER PUBLICATIONS

"22. DC-AC Interverter (6)", PowerPoint Lecture, Osaka Prefecture University Technical Junior College, Electronic Information Course, http://www2-kawakami.ct.osakafu-u.ac.jp/omu-content/uploads/sites/1161/Lecture_Data/Power_Electronics/01_Lecture/22_lecture_power_electronics.pdf.

* cited by examiner

ELECTRONIC APPARATUS, SWITCHING SYSTEM, AND CONTROL METHOD

CROSS REFERENCE TO RELATED APPLICATIONS

This application is based upon and claims the benefit of priority from the prior Japanese Patent Application No. 2022-138786, filed on Aug. 31, 2022, the entire contents of which are incorporated herein by reference.

FIELD

One embodiment of the present invention relates to an electronic apparatus, a switching system, and a control method.

BACKGROUND

A technology has been proposed, in which when a plurality of inverter devices is connected to an AC system, a pulse width modulation (PWM) frequency of each of a plurality of inverter device is variably controlled based on noise generation situation in the surrounding environment.

However, even if the PWM frequency of the plurality of inverter devices is variably controlled, there is a risk that on or off timing of switching elements in the plurality of inverter devices overlaps, and thus large electromagnetic noise occurs due to the noise enhancement effect.

DETAILED DESCRIPTION

According to the present disclosure, an electronic apparatus includes:
a noise measurer that measures electromagnetic noise in a surrounding environment; and
a controller that controls timing of turning on or off a switching circuit based on the electromagnetic noise measured by the noise measurer.

Embodiments of an electronic apparatus, a switching system, and a control method will be described below with reference to the drawings. Although main components of the electronic apparatus and the switching system will be mainly described below, there may be components or functions that are not illustrated or described in the electronic apparatus and the switching system. The following description does not exclude components or functions that are not illustrated or described.

First Embodiment

Figure 1:
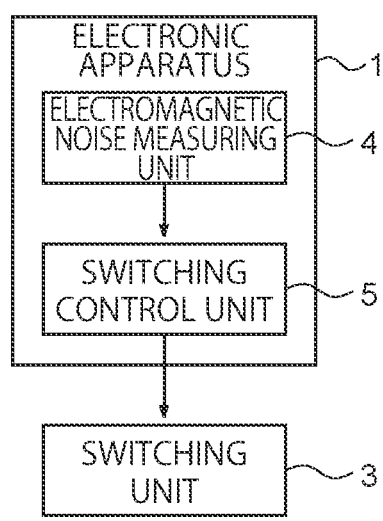
FIG. 1 is a block diagram showing a schematic configuration of an electronic apparatus and a switching system according to a first embodiment.

FIG. 1 is a block diagram showing a schematic configuration of an electronic apparatus 1 and a switching system 2 according to a first embodiment. The switching system 2 of FIG. 1 includes a switching unit 3 and the electronic apparatus 1. The electronic apparatus 1 may be called as a control device. The switching unit 3 may be called as a switching circuit. The electronic apparatus 1 includes an electromagnetic noise measuring unit 4 and a switching control unit 5. In this specification, the electromagnetic noise measuring unit 4 may be called as noise measurement circuitry, and the switching control unit 5 may be called as a controller. There may be a case where a plurality of sets of the switching unit 3 and the electronic apparatus 1 is provided in the switching system 2.

The switching unit 3 includes one or more switching elements and performs a switching operation to turn on or off the switching elements with predetermined timing. The switching unit 3 includes an inverter, a converter, a transformer, and the like, and converts DC/AC, converts voltage, current, frequency, number of phases, and the like with power loss suppressed.

The switching unit 3 is used, for example, for a power conversion device that converts a DC voltage generated by a renewable energy power generation facility such as a photovoltaic (PV) device into an AC voltage. This type of power conversion device is also referred to as a power conditioner (PCS: power conditioning subsystem). The power conversion device may incorporate not only the switching unit 3 of FIG. 1 but also the electronic apparatus 1. Note that the power conversion device may have a mode for converting a DC voltage into an AC voltage and a mode for converting an AC voltage into a DC voltage.

The electromagnetic noise measuring unit 4 measures electromagnetic noise in a surrounding environment. The surrounding environment refers to some noise source located around the switching system 2 of FIG. 1 and can have any type of noise source. For example, the electromagnetic noise measuring unit 4 uses an antenna to measure the electromagnetic noise. In more detail, the electromagnetic noise may be measured using a directional antenna so as not to be affected by the electromagnetic noise of the switching unit 3. In this case, the directivity of the directional antenna is preferably directed in a direction different from the disposition direction of the switching unit 3.

When the electromagnetic noise measuring unit 4 measures the electromagnetic noise in the surrounding environment, the switching operation of the switching unit 3 may be stopped. This allows the electromagnetic noise measuring unit 4 to measure the electromagnetic noise in the surrounding environment in the situation where no electromagnetic noise is generated from the switching unit 3, and more accurately measure the electromagnetic noise in the surrounding environment.

The switching control unit 5 controls timing of turning on or off the switching unit 3 based on the electromagnetic noise measured by the electromagnetic noise measuring unit 4. For example, when the electromagnetic noise measuring unit 4 outputs a noise signal indicating the level of the electromagnetic noise, the switching control unit 5 controls switching on or off of the switching unit 3 according to the timing with which the noise signal level becomes equal to or less than a predetermined threshold. When the electromagnetic noise measuring unit 4 outputs a noise signal indicating the electromagnetic noise generation timing, the switching control unit 5 controls switching on or off of the switching unit 3 according to the timing with which no noise signal is generated. The switching control unit 5 may be a semiconductor chip or a discrete digital circuit component that performs digital signal processing such as a central processing unit (CPU) or digital signal processor (DSP), or may be a semiconductor chip or a discrete component that performs analog signal processing.

Figure 2A:
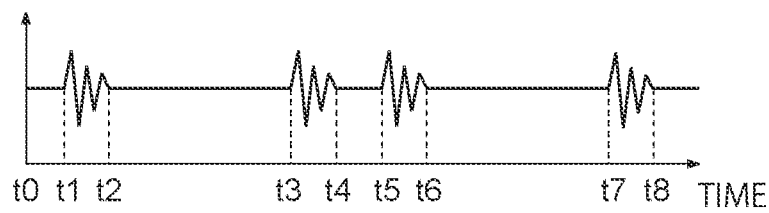
FIG. 2A is a diagram showing an electromagnetic noise waveform in a surrounding environment measured by an electromagnetic noise measuring unit.
Figure 2B:
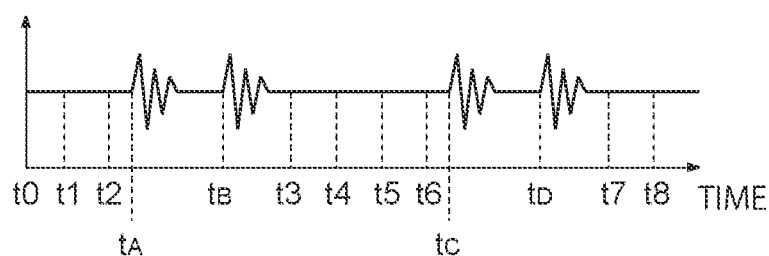
FIG. 2B is a diagram showing an example in which a switching unit performs a switching operation in a period from time t2 to t3 and a period from time t6 to t7.

FIGS. 2A and 2B are diagrams describing the processing control of the switching control unit 5. FIG. 2A is a diagram showing an electromagnetic noise waveform in the surrounding environment measured by the electromagnetic noise measuring unit 4. In FIGS. 2A and 2B, the horizontal axis is time, whereas the vertical axis is the signal level of the electromagnetic noise. FIG. 2A shows an example in which the electromagnetic noise is generated from time t1 to t2, from time t3 to t4, from time t5 to t6, and from time t7 to t8.

If the switching unit 3 performs the switching operation with timing that overlaps with the electromagnetic noise generation timing in the surrounding environment, there is a risk that large electromagnetic noise may be generated by the noise enhancement effect. Therefore, the switching control unit 5 causes the switching unit 3 to perform the switching operation with timing different from the electromagnetic noise generation timing in the surrounding environment, as shown in FIG. 2B.

FIG. 2B is a diagram showing an example in which the switching unit 3 performs the switching operation in a period from time t2 to t3 and a period from time t6 to t7 by control of the switching control unit 5. In more detail, in the example of FIG. 2B, the switching control unit 5 causes the switching unit 3 to perform the switching operation at a time tA after time t2 and before time t3, a time tB after time tA and before time t3, a time tC after time t6 and before time t7, and a time tD after time tC and before time t7.

This allows the electromagnetic noise generation timing of the switching unit 3 where the switching control unit 5 performs switching control to be shifted from the electromagnetic noise generation timing in the surrounding environment, and there is no risk that the electromagnetic noise will increase due to the noise enhancement effect.

Figure 3:
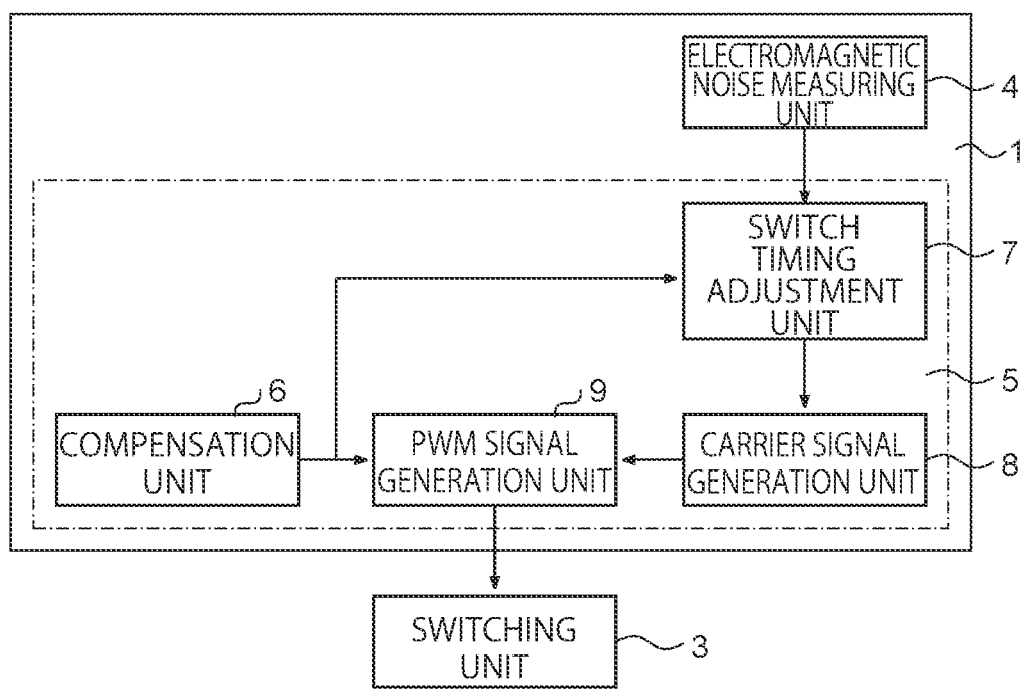
FIG. 3 is a block diagram showing one example of an internal configuration of a switching control unit.

FIG. 3 is a block diagram showing one example of the internal configuration of the switching control unit 5. The switching control unit 5 of FIG. 3 includes a compensation unit 6, a switch timing adjustment unit 7, a carrier signal generation unit 8, and a PWM signal generation unit 9.

The compensation unit 6 generates a compensation value such that the AC signal output from the switching unit 3 agrees with a target signal, and generates an instruction signal based on the compensation value. In this specification, the compensation unit 6 is referred to as an instruction signal generation unit in some cases. The instruction signal is input into the PWM signal generation unit 9 and the switch timing adjustment unit 7.

The switch timing adjustment unit 7 sets at least one of the waveform shape, frequency, or phase of the carrier signal to cause the switching unit 3 to perform the switching operation outside the period in which the electromagnetic noise is observed from the instruction signal from the compensation unit 6 and the waveform of the electromagnetic noise measured by the electromagnetic noise measuring unit 4.

The carrier signal generation unit 8 generates the carrier signal based on the waveform shape, frequency, or phase of the carrier signal set by the switch timing adjustment unit 7. The carrier signal is, for example, a triangular wave signal. Note that the carrier signal may be a saw wave signal, a sine wave signal, a square wave signal, or the like, and can have any waveform shape.

The PWM signal generation unit 9 generates a PWM signal for turning on or off the switching unit 3. The PWM signal generation unit 9 generates the PWM signal by comparing the relationship in terms of size between the carrier signal generated by the carrier signal generation unit 8 and the instruction signal generated by the compensation unit 6.

In this way, the switching control unit 5 controls the timing of turning on or off the switching unit 3 with the carrier signal whose at least one of the waveform shape, frequency, or phase is controlled based on the electromagnetic noise measured by the electromagnetic noise measuring unit 4.

Figure 4:
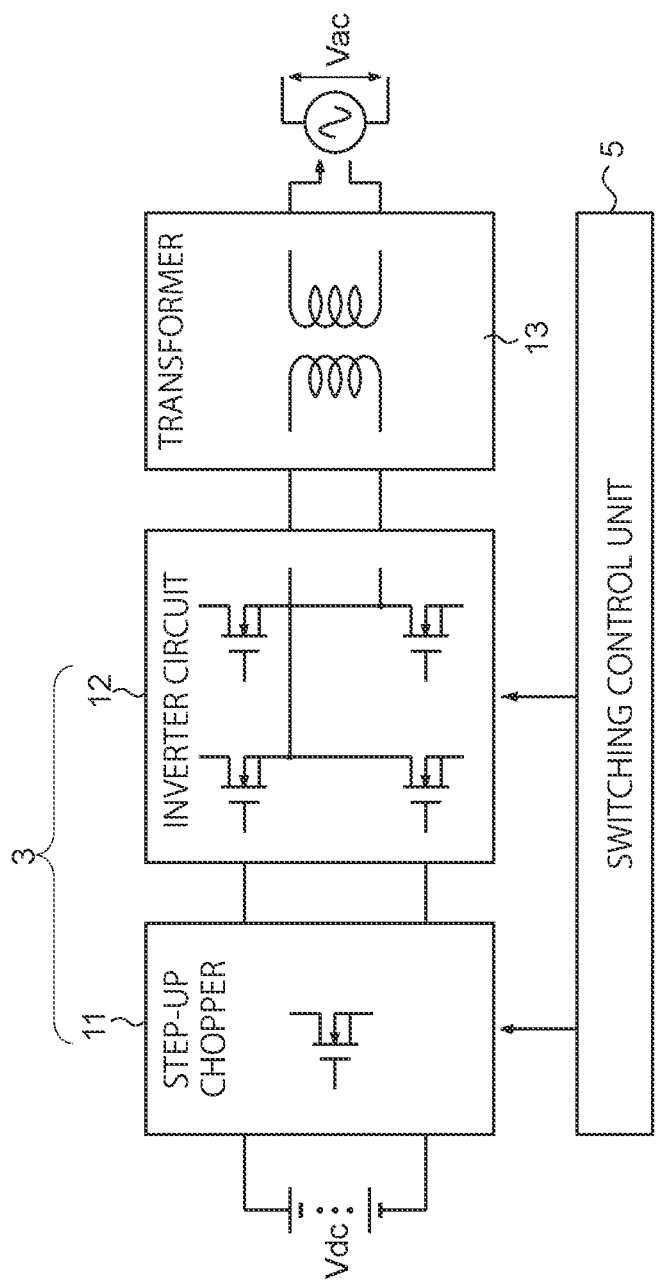
FIG. 4 is a block diagram showing the internal configuration of the switching unit.

FIG. 4 is a block diagram showing the internal configuration of the switching unit 3. The switching unit 3 includes a step-up chopper circuit 11, an inverter circuit 12, and a transformer 13.

A DC voltage Vdc generated by, for example, a renewable energy power generation facility such as a photovoltaic power generation facility is input into the step-up chopper circuit 11. The step-up chopper circuit 11 converts the voltage amplitude of the input DC voltage Vdc. The inverter circuit 12 converts the output voltage of the step-up chopper circuit 11 into an AC voltage Vac. The inverter circuit 12 turns on or off the switching unit 3 based on the PWM signal generated using the carrier signal and the instruction signal to be described later, thereby generating the AC voltage Vac. The transformer 13 converts the voltage amplitude of the AC voltage Vac to generate, for example, a commercial power supply voltage of 100 V. The switching control unit 5 controls the step-up chopper circuit 11 and the inverter circuit 12.

Figure 5:
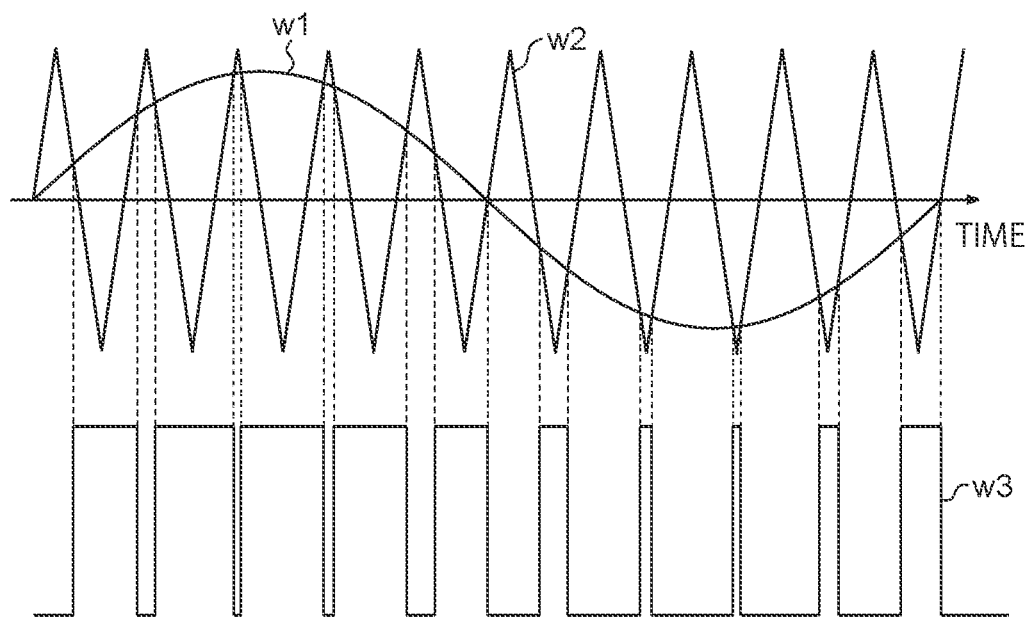
FIG. 5 is a signal waveform diagram of an instruction signal w1, a carrier signal w2, and a PWM signal W3.
Figure 6:
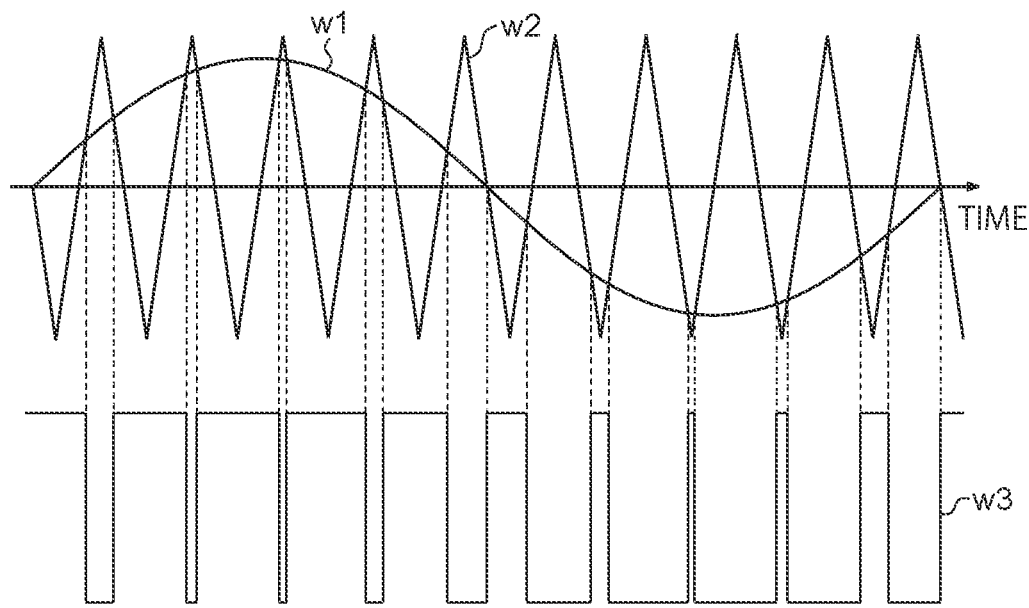
FIG. 6 is a diagram showing an example in which the phase of the carrier signal w2 is shifted by 180 degrees from FIG. 5.

FIGS. 5 and 6 are signal waveform diagrams of an instruction signal w1, a carrier signal w2, and a PWM signal W3. The instruction signal w1 generated by the compensation unit 6 has the same degree of frequency as the frequency of the AC signal output by the switching unit 3 (for example, 50 Hz to 60 Hz). The carrier signal w2 generated by the carrier signal generation unit 8 is a signal having a much higher frequency than the instruction signal w1, for example, a triangular wave signal. The PWM signal generation unit 9 sets the PWM signal W3 to a high level, for example, when the signal amplitude of the instruction signal w1 is greater than the signal amplitude of the carrier signal w2, and sets the PWM signal W3 to a low level when the signal amplitude of the instruction signal w1 is equal to or less than the signal amplitude of the carrier signal w2. This generates the PWM signal W3 with a varying pulse width, as shown in FIG. 5.

FIG. 6 is a diagram showing an example in which the phase of the carrier signal w2 is shifted by 180 degrees from FIG. 5. As shown in FIG. 6, when the phase of the carrier signal w2 shifts, the timing with which the PWM signal W3 becomes a high level also shifts. In this way, by controlling the phase of the carrier signal w2 by the carrier signal generation unit 8 in this way, the timing and period in which the PWM signal W3 becomes a high level can be controlled.

The PWM signal W3 is used to control switching timing of turning on or off the switching unit 3. By controlling at least one of the frequency or phase of the carrier signal w2 by the carrier signal generation unit 8, the pulse width of the PWM signal W3 can be controlled. This makes it possible to control the timing with which the switching unit 3 performs the switching operation and to control the timing with which the electromagnetic noise is generated.

In this way, in the first embodiment, the electromagnetic noise measuring unit measures the electromagnetic noise in the surrounding environment and supplies the measurement result to the switch timing adjustment unit 7. The switch timing adjustment unit 7 sets at least one of the waveform shape, frequency, or phase of the carrier signal to cause the switching unit 3 to perform the switching operation outside the period in which the electromagnetic noise is observed from the instruction signal from the compensation unit 6 and the waveform of the electromagnetic noise measured by the electromagnetic noise measuring unit 4. The carrier signal generation unit 8 generates the carrier signal according to the settings of the switch timing adjustment unit 7. The PWM signal generation unit 9 generates the PWM signal by comparing the relationship in terms of size between the carrier signal generated by the carrier signal generation unit 8 and the instruction signal generated by the compensation unit 6. The switching unit 3 is controlled to switch on or off based on the PWM signal. This makes it possible to cause the switching unit 3 to perform the switching operation according to timing with which the electromagnetic noise in the surrounding environment is small, and to prevent the noise enhancement effect from being produced between the electromagnetic noise in the surrounding environment and the electromagnetic noise of switching.

Second Embodiment

Figure 7:
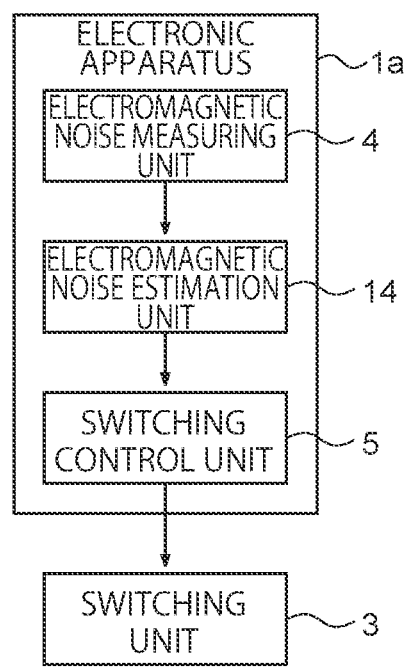
FIG. 7 is a block diagram showing a schematic configuration of an electronic apparatus and a switching system according to a second embodiment.

FIG. 7 is a block diagram showing a schematic configuration of an electronic apparatus 1a and a switching system 2a according to a second embodiment. In the switching system 2a of FIG. 7, the configuration of the electronic apparatus 1a differs from the configuration in FIG. 1. The electronic apparatus 1a of FIG. 7 includes an electromagnetic noise estimation unit 14 in addition to an electromagnetic noise measuring unit 4 and a switching control unit 5. In this specification, the electromagnetic noise estimation unit 14 may be called as processing circuitry.

Based on electromagnetic noise measured by the electromagnetic noise measuring unit 4, the electromagnetic noise estimation unit 14 estimates (predicts) the electromagnetic noise after the measurement. The electromagnetic noise estimation unit 14 may be realized by a processing unit. The switching control unit 5 controls timing of turning on or off a switching unit 3 based on the electromagnetic noise estimated by the electromagnetic noise estimation unit 14. The internal configuration of the switching control unit is the same as in FIG. 3.

Based on time-series information on the electromagnetic noise measured by the electromagnetic noise measuring unit 4, the electromagnetic noise estimation unit 14 may estimate the time-series information on the electromagnetic noise after the measurement. Here, the time-series information contains electromagnetic noise estimation information in a period after the measurement of the electromagnetic noise. The switching control unit 5 turns on or off the switching unit 3 with timing that does not overlap with the estimated period of the electromagnetic noise generation contained in the time-series information.

The electromagnetic noise estimation unit 14 estimates the electromagnetic noise in the surrounding environment that does not contain the electromagnetic noise generated by the switching unit 3 based on a control signal output by the switching control unit 5 to turn on or off the switching unit 3. The switching control unit 5 controls the timing of turning on or off the switching unit 3 such that the timing of the electromagnetic noise generated by the switching unit 3 differs from the electromagnetic noise generation timing as estimated by the electromagnetic noise estimation unit 14.

Figure 8A:
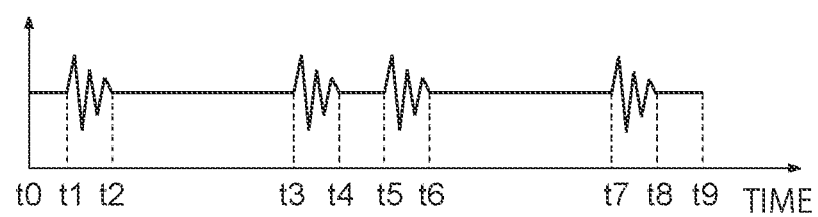
FIG. 8A is a diagram showing time-series information on electromagnetic noise measured by an electromagnetic noise measuring unit.
Figure 8B:
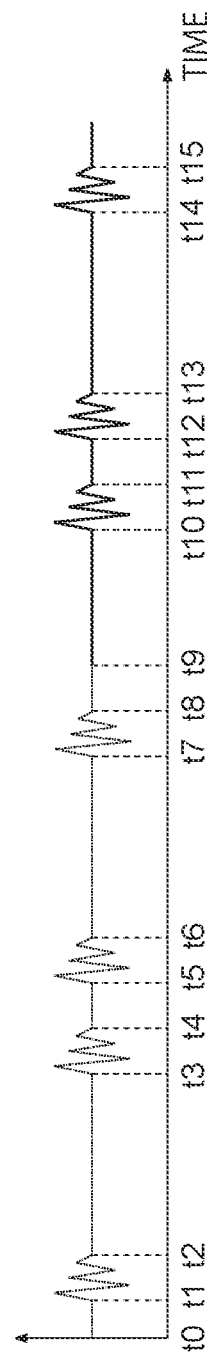
FIG. 8B is a diagram showing the time-series information on the electromagnetic noise estimated by an electromagnetic noise estimation unit.
Figure 8C:
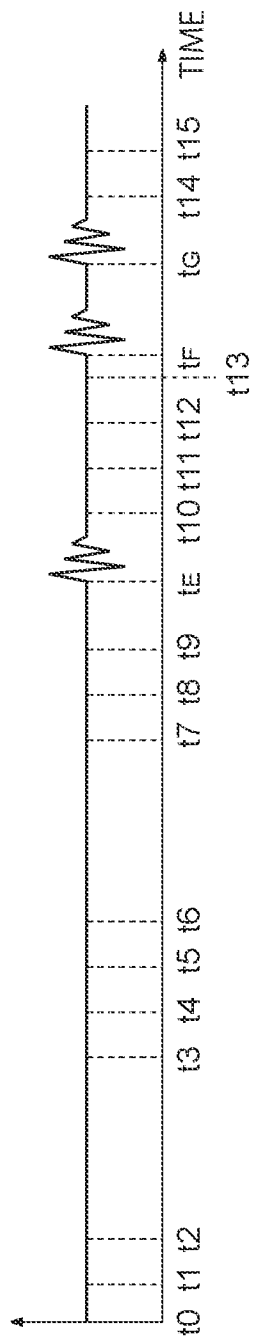
FIG. 8C is a diagram showing timing with which a switching unit performs a switching operation.

FIGS. 8A, 8B, and 8C are diagrams showing the time-series information on the electromagnetic noise estimated by the electromagnetic noise estimation unit 14. In these diagrams, the horizontal axis is time, whereas the vertical axis is the signal level of the electromagnetic noise. FIG. 8A is a waveform diagram of the electromagnetic noise measured by the electromagnetic noise measuring unit 4. As shown in FIG. 8A, the electromagnetic noise is generated at times t1 to t2, t3 to t4, t5 to t6, and t7 to t8.

Based on the electromagnetic noise before time t8 measured by the electromagnetic noise measuring unit 4, the electromagnetic noise estimation unit 14 estimates the electromagnetic noise after time t9. When the electromagnetic noise in the surrounding environment has periodicity, based on the generation timing of the electromagnetic noise measured from time t1 to t8 shown in FIG. 8A, the electromagnetic noise estimation unit 14 estimates that the electromagnetic noise will be generated at times t10 to t11, t12 to t13, and t14 to t15, as shown in FIG. 8B. FIG. 8B is a diagram showing the time-series information on the electromagnetic noise estimated by the electromagnetic noise estimation unit 14. Note that periodicity refers to the appearance of identical or similar waveform shapes of the electromagnetic noise at identical time intervals.

The switching control unit 5 causes the switching unit 3 to perform the switching operation with timing shown in FIG. 8C based on the time-series information on the electromagnetic noise from the electromagnetic noise estimation unit 14. Time tE in FIG. 8C is time between time t9 and time t10. Time tF is time between time t13 and time t14. Time tG is time after time tF and before time t14. The time tE, tF, and tG in FIG. 8C all deviate from the estimated period of the electromagnetic noise generation estimated by the electromagnetic noise estimation unit 14, and by causing the switching operation starting at time tE, tF, and tG, the noise enhancement effect of the electromagnetic noise can be prevented and the maximum signal amplitude level of the electromagnetic noise can be suppressed.

In FIGS. 8A, 8B, and 8C, an example of causing the switching unit 3 to perform the switching operation in the period when it is estimated that the electromagnetic noise is not generated has been described. As one modification, the switching control unit 5 may cause the switching unit 3 to perform the switching operation in the period when the estimated level of electromagnetic noise generation is, for example, equal to or less than half of the average level of the electromagnetic noise. In this case as well, the noise enhancement effect can be prevented, and the maximum signal amplitude level of the electromagnetic noise can be suppressed.

As a method for estimating electromagnetic noise by the electromagnetic noise estimation unit 14, the method using the autoregressive integrated and moving average (ARIMA) process model, the method using time-series data estimation algorithm using machine learning or deep learning, and the like can be applied. For example, in the switching control system, when the output is connected to a 50 Hz power system and the switching unit 3 operates in synchronization with the system, electromagnetic noise is generated periodically with a cycle of 20 ms (=1/50 Hz). In this way, when the electromagnetic noise is generated periodically, by calculating the autocorrelation coefficient, periodic timing of the electromagnetic noise can be known and the electromagnetic noise can be estimated.

The electromagnetic noise estimation unit 14 can detect the electromagnetic noise in the surrounding environment of its own switching unit 3, by using the on or off switching control information of the switching unit 3, generating the generation waveform of the electromagnetic noise generated from its own switching unit 3 from the generation timing of the electromagnetic noise of its own switching unit 3, and subtracting this waveform from the electromagnetic noise waveform measured by the electromagnetic noise measuring unit 4. By controlling the frequency of the carrier signal and the like by the switch timing adjustment unit 7 based on the detected electromagnetic noise in the surrounding environment, the switching unit 3 can perform the switching operation with timing different from the generation timing of the detected electromagnetic noise in the surrounding environment.

Alternatively, the electromagnetic noise measuring unit 4 may measure the electromagnetic noise in the surrounding environment by using a directional antenna in order not to measure the electromagnetic noise generated by its own switching unit 3. In this case, processing for subtracting the waveform of the electromagnetic noise generated from its own switching unit 3 from the waveform of the electromagnetic noise measured by the electromagnetic noise measuring unit 4 is unnecessary.

Figure 9:
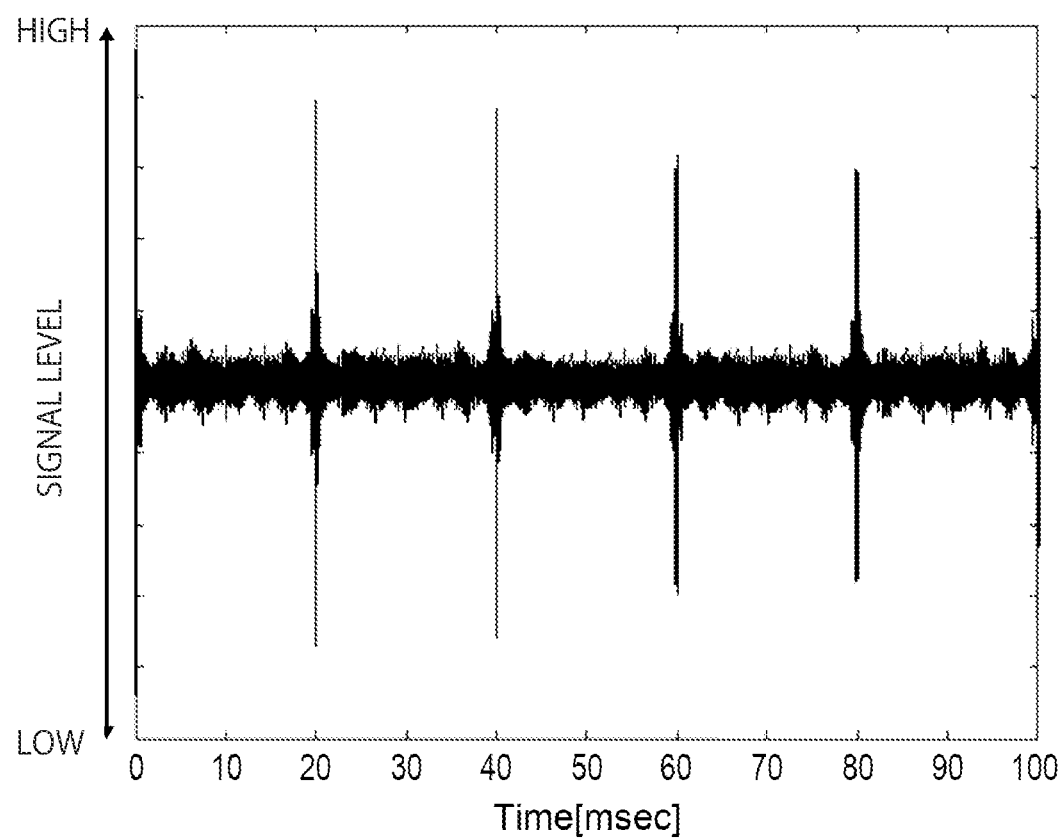
FIG. 9 is a diagram showing another example of a waveform of electromagnetic noise measured by the electromagnetic noise measuring unit.

FIG. 9 is a diagram showing another example of the waveform of the electromagnetic noise measured by the electromagnetic noise measuring unit 4. The power conversion device that connects the DC voltage Vdc output from a renewable energy power generation facility such as a photovoltaic power generation facility to the commercial AC power supply converts the DC voltage Vdc into, for example, the AC voltage Vac of 50 Hz. Therefore, as shown in FIG. 9, the power conversion device generates the electromagnetic noise, for example, with a cycle of 50 Hz. If the measurement by the electromagnetic noise measuring unit 4 shows that electromagnetic noise is generated with a cycle of 50 Hz, the electromagnetic noise estimation unit 14 estimates that the electromagnetic noise will be generated with the same cycle after the measurement. The switching control unit 5 causes the switching unit 3 to perform the switching operation in a period different from the estimated period of electromagnetic noise generation estimated by the electromagnetic noise estimation unit 14.

In this way, according to the second embodiment, the electromagnetic noise estimation unit 14 estimates the time-series information on the electromagnetic noise after the measurement based on the electromagnetic noise measured by the electromagnetic noise measuring unit 4. Since the electromagnetic noise has periodicity, the electromagnetic noise estimation unit 14 can estimate the time-series information on the electromagnetic noise relatively accurately. Based on the estimated time-series information on the electromagnetic noise, the switching control unit 5 causes the switching unit 3 to perform the switching operation with timing that does not overlap with the estimated period of electromagnetic noise generation. Accordingly, even if the period in which the electromagnetic noise measuring unit 4 measures electromagnetic noise is short, the estimated period of electromagnetic noise generation can be accurately estimated over a long period of time, and by controlling the timing of causing the switching unit 3 to perform the switching operation based on the estimation result, the noise enhancement effect can be prevented, and the maximum signal amplitude level of the electromagnetic noise can be suppressed.

The above-described embodiments may be configured as follows.

(1) An electronic apparatus comprising:
   noise measurement circuitry that measures electromagnetic noise in a surrounding environment; and
   a controller that controls timing of turning on or off a switching circuit based on the electromagnetic noise measured by the noise measurement circuitry.

(2) The electronic apparatus according to (1), wherein
   the controller controls switching of turning on or off the switching circuit with the timing different from generation timing of the electromagnetic noise measured by the noise measurement circuitry.

(3) The electronic apparatus according to (1) or (2), wherein
   the noise measurement circuitry outputs a noise signal indicating a level of the electromagnetic noise, and
   the controller controls switching of turning on or off the switching circuit with timing when the level of the noise signal becomes equal to or less than a predetermined value.

(4) The electronic apparatus according to (1) or (2), wherein
   the noise measurement circuitry outputs a noise signal indicating generation timing of the electromagnetic noise, and
   the controller controls switching of turning on or off the switching circuit with timing when the noise signal is not generated.

(5) The electronic apparatus according to (1) or (2), further comprising
   processing circuitry configured to estimate the electromagnetic noise after the measurement based on the electromagnetic noise measured by the noise measurement circuitry,
   wherein the controller controls the timing of switching on or off the switching circuit based on the electromagnetic noise estimated by the processing circuitry.

(6) The electronic apparatus according to (5), wherein
   the processing circuitry is configured to estimate time-series information on the electromagnetic noise after the measurement based on the time-series information on the electromagnetic noise measured by the noise measurement circuitry.

(7) The electronic apparatus according to (6), wherein
   the controller turns on or off the switching circuit with timing that does not overlap with an estimated generation period of the electromagnetic noise contained in the time-series information.

(8) The electronic apparatus according to any one of (5) to (7), wherein
the processing circuitry is configured to estimate the electromagnetic noise in the surrounding environment that does not include electromagnetic noise generated by the switching circuit based on a control signal output by the controller for turning on or off the switching circuit, and
the controller controls the timing of turning on or off the switching circuit differently from generation timing of the electromagnetic noise in the surrounding environment estimated by the processing circuitry.

(9) The electronic apparatus according to any one of (1) to (8), wherein
the noise measurement circuitry measures the electromagnetic noise around the switching circuit with a switching operation of the switching circuit stopped.

(10) The electronic apparatus according to any one of (1) to (9), wherein
the controller controls the timing of turning on or off the switching circuit with a carrier signal whose at least one of a waveform shape, a frequency, or a phase is controlled based on the electromagnetic noise measured by the noise measurement circuitry.

(11) The electronic apparatus according to (10), wherein the controller is configured to:
set at least one of a waveform shape, a frequency, or a phase of a carrier signal to turn on or off the switching circuit with timing different from generation timing of the electromagnetic noise measured by the noise measurement circuitry; and
generate the carrier signal based on at least one of the waveform shape, the frequency, or the phase of the carrier signal.

(12) The electronic apparatus according to (11), wherein the controller is configured to:
generate an instruction signal to make an output signal of the switching circuit agree with a target signal; and
compare a relationship in terms of size between the instruction signal and the carrier signal to generate a PWM signal,
wherein the switching circuit is controlled to be switched on or off by the PWM signal.

(13) The electronic apparatus according to (1) to (12), wherein
the noise measurement circuitry measures the electromagnetic noise with a directional antenna having directivity in a direction different from a disposition direction of the switching circuit.

(14) The electronic apparatus according to any one of (1) to (13), wherein
the noise measurement circuitry measures the electromagnetic noise around the switching circuit in a power conversion device that converts a DC voltage generated by a renewable energy power generation facility into an AC voltage.

(15) A switching system comprising:
a switching circuit;
a noise measurement circuitry that measures electromagnetic noise around the switching circuit; and
a controller that controls timing of turning on or off the switching circuit based on the electromagnetic noise measured by the noise measurement circuitry.

(16) The switching system according to (15), further comprising
a power conversion device that converts a DC voltage generated by a renewable energy power generation facility into an AC voltage,
wherein the power conversion device includes the switching circuit.

(17) A control method comprising:
measuring electromagnetic noise around a switching circuit; and
controlling timing of turning on or off the switching circuit based on the measured electromagnetic noise.

While certain embodiments have been described, these embodiments have been presented by way of example only, and are not intended to limit the scope of the disclosures. Indeed, the novel methods and systems described herein may be embodied in a variety of other forms; furthermore, various omissions, substitutions and changes in the form of the methods and systems described herein may be made without departing from the spirit of the disclosures. The accompanying claims and their equivalents are intended to cover such forms or modifications as would fall within the scope and spirit of the disclosures.

The invention claimed is:

1. An electronic apparatus comprising:
noise measurement circuitry that measures electromagnetic noise in a surrounding environment; and
a controller that controls a timing of turning on or off a switching circuit based on the electromagnetic noise measured by the noise measurement circuitry,
wherein:
the noise measurement circuitry outputs a noise signal indicating a generation timing of the electromagnetic noise, and
the controller controls switching of turning on or off the switching circuit with a timing when the noise signal is not generated.

2. The electronic apparatus according to claim 1, wherein the timing is different from the generation timing of the electromagnetic noise measured by the noise measurement circuitry.

3. The electronic apparatus according to claim 1, wherein:
the noise measurement circuitry outputs a noise signal indicating a level of the electromagnetic noise, and
the controller controls switching of turning on or off the switching circuit with a timing when the level of the noise signal becomes equal to or less than a predetermined value.

4. The electronic apparatus according to claim 1, wherein the noise measurement circuitry measures the electromagnetic noise around the switching circuit in a power conversion device that converts a DC voltage generated by a renewable energy power generation facility into an AC voltage.

5. An electronic apparatus comprising:
noise measurement circuitry that measures electromagnetic noise in a surrounding environment;
a controller that controls a timing of turning on or off a switching circuit based on the electromagnetic noise measured by the noise measurement circuitry; and
processing circuitry configured to estimate the electromagnetic noise after the measurement based on the electromagnetic noise measured by the noise measurement circuitry,
wherein the controller controls the timing of switching on or off the switching circuit based on the electromagnetic noise estimated by the processing circuitry.

6. The electronic apparatus according to claim 5, wherein the processing circuitry is configured to estimate time-series information on the electromagnetic noise after the measurement based on the time-series information on the electromagnetic noise measured by the noise measurement circuitry.

7. The electronic apparatus according to claim 6, wherein the controller turns on or off the switching circuit with a timing that does not overlap with an estimated generation period of the electromagnetic noise contained in the time-series information.

8. The electronic apparatus according to claim 5, wherein;
the processing circuitry is configured to estimate the electromagnetic noise in the surrounding environment that does not include electromagnetic noise generated by the switching circuit based on a control signal output by the controller for turning on or off the switching circuit, and
the controller controls the timing of turning on or off the switching circuit differently from a generation timing of the electromagnetic noise in the surrounding environment estimated by the processing circuitry.

9. An electronic apparatus comprising:
noise measurement circuitry that measures electromagnetic noise in a surrounding environment; and
a controller that controls a timing of turning on or off a switching circuit based on the electromagnetic noise measured by the noise measurement circuitry,
wherein the noise measurement circuitry measures the electromagnetic noise around the switching circuit with a switching operation of the switching circuit stopped.

10. An electronic apparatus comprising:
noise measurement circuitry that measures electromagnetic noise in a surrounding environment; and
a controller that controls a timing of turning on or off a switching circuit based on the electromagnetic noise measured by the noise measurement circuitry,
wherein the controller controls the timing of turning on or off the switching circuit with a carrier signal at least one of a waveform shape, a frequency, or a phase of which is controlled based on the electromagnetic noise measured by the noise measurement circuitry,
wherein the controller is configured to:
set the at least one of the waveform shape, the frequency, or the phase of the carrier signal to turn on or off the switching circuit with a timing different from a generation timing of the electromagnetic noise measured by the noise measurement circuitry;
generate the carrier signal based on the at least one of the waveform shape, the frequency, or the phase of the carrier signal;
generate an instruction signal to make an output signal of the switching circuit agree with a target signal; and
compare a relationship in terms of size between the instruction signal and the carrier signal to generate a PWM signal, and
wherein the switching circuit is controlled to be switched on or off by the PWM signal.

11. An electronic apparatus comprising:
noise measurement circuitry that measures electromagnetic noise in a surrounding environment; and
a controller that controls a timing of turning on or off a switching circuit based on the electromagnetic noise measured by the noise measurement circuitry,
wherein the noise measurement circuitry measures the electromagnetic noise with a directional antenna having directivity in a direction different from a disposition direction of the switching circuit.

12. A switching system comprising:
a switching circuit;
noise measurement circuitry that measures electromagnetic noise around the switching circuit; and
a controller that controls a timing of turning on or off the switching circuit based on the electromagnetic noise measured by the noise measurement circuitry,
wherein:
the noise measurement circuitry outputs a noise signal indicating a generation timing of the electromagnetic noise, and
the controller controls switching of turning on or off the switching circuit with a timing when the noise signal is not generated.

13. The switching system according to claim 12, further comprising:
a power conversion device that converts a DC voltage generated by a renewable energy power generation facility into an AC voltage,
wherein the power conversion device includes the switching circuit.

14. A control method comprising:
measuring electromagnetic noise around a switching circuit;
controlling a timing of turning on or off the switching circuit based on the measured electromagnetic noise;
outputting a noise signal indicating a generation timing of the electromagnetic noise; and
controlling switching of turning on or off the switching circuit with a timing when the noise signal is not generated.

* * * * *